United States Patent [19]
Park

[11] 4,312,258
[45] Jan. 26, 1982

[54] BATTERY POWERED ELECTRONIC GUITAR

[75] Inventor: Hun S. Park, Seoul, Rep. of Korea

[73] Assignee: Hyo-San Industries Co., Ltd., Seoul, Rep. of Korea

[21] Appl. No.: 91,740

[22] Filed: Nov. 6, 1979

[30] Foreign Application Priority Data

Nov. 16, 1978 [KR] Rep. of Korea ................ 78-5815[U]

[51] Int. Cl.³ .......................... G10H 3/00; H05K 5/00

[52] U.S. Cl. .................................... 84/1.16; 181/150; 181/151; 181/172

[58] Field of Search ................ 84/1.16, 171; 181/151, 181/172, 150

[56] References Cited

U.S. PATENT DOCUMENTS 3,194,870 7/1965 Tondreau et al. .................. 84/1.16
3,978,941 9/1976 Siebert ............................... 181/151
4,123,621 10/1978 Walker ............................... 181/151

*Primary Examiner*—J. V. Truhe
*Assistant Examiner*—Forester W. Isen
*Attorney, Agent, or Firm*—McAulay, Fields, Fisher, Goldstein & Nissen

[57] ABSTRACT

An improved speaker mounting for an electronic guitar is provided. The mounting includes a rubber cup extending into the interior of the guitar from a cut out in the top board surface of the guitar. The cup has a flanged rim extending about the opening and a grove formed below the flange. A speaker is disposed within the cup and has portions captured in position by the grove. A cap is positioned over the cut out and screw means extend through the cap and cup flange into the guitar top surface securing the cap and flange to the top surface.

2 Claims, 2 Drawing Figures

BATTERY POWERED ELECTRONIC GUITAR

BACKGROUND OF THE INVENTION

The present invention relates to electronic guitars and in particular to an improved mounting for the guitar speaker whereby unwanted vibrations of the guitar's strings during operation are prevented.

In the conventional electronic guitar, the pick-up and speaker are so closely spaced from one another that sound waves eminating from the speaker are transmitted to the guitar body thereby causing the guitar strings to vibrate creating a howlinglike sound. Heretofore several attempts have been made to overcome this phenomena. In one attempt, the guitar bridge and body are separated by a sound insulating rubber packing. This, however, presents severe manufacturing difficulties. In addition, when the guitar is played without electronic amplification the sound insulator causes the output of the guitar to be diminished.

In another arrangement, the guitar speaker is enclosed within a double cylinder passing through the guitar body. The double cylinders are open at the top and bottom ends so that sound from the speaker eminates through the open ends of the speaker rather than traveling laterally through the guitar body. The double cylinder serves to isolate the guitar body from the sound waves and thus prevent the guitar body from vibrating in response to the speaker sounds. While this construction is able to prevent the unwanted string howling, the structure is complicated to manufacture and assemble. In addition, this construction requires perforations on the speaker top and bottom surfaces and thus renders the speaker unattractive to some.

In view of the above, it is the principal object of the present invention to provide an improved speaker mounting for electronic quitars which prevents undue vibrations in the guitar body caused by the speaker of vibrating the guitar strings.

A further object is to provide a speaker mounting which is attractive and which may be readily assembled and constructed.

SUMMARY OF THE INVENTION

The above and other beneficial objects and advantages are attained in accordance with the present invention by providing a guitar having a top surface board formed with and opening therein. A rubber cup is suspended from its rim into the guitar interior through the opening. A noise absorbent material is affixed to the inner surface of the cup. A speaker is positioned within the cup with its frame fitted into a groove about the opening in the cup. A cap fits over the speaker opening and is secured to the cup rim and the surfaces of the guitar top surface board defining the opening.

DETAILED DESCRIPTION OF THE PREFERRED EMBODIMENT

Figure 1:
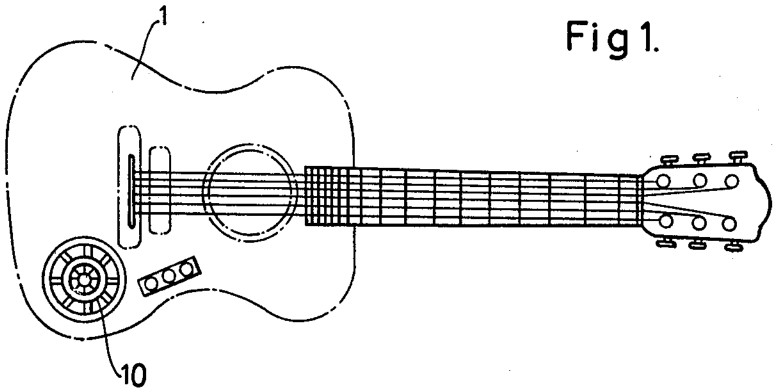
FIG. 1 is a top plan view of an electrical guitar.
Figure 2:
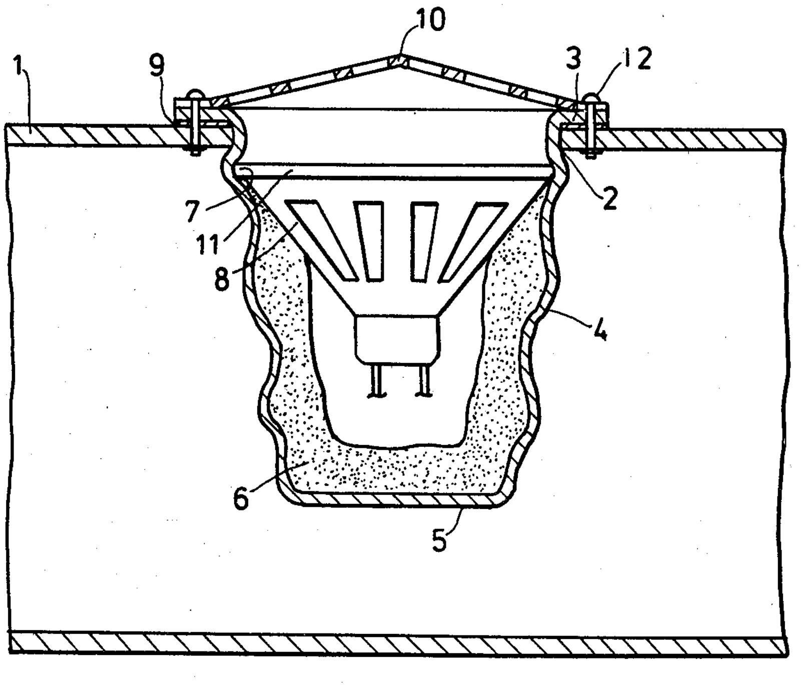
FIG. 2 is an enlarged fragmentary sectional view taken through the speaker portion of the guitar of FIG. 1.

Reference is now made to the drawings wherein a guitar in accordance with the present invention is depicted. As shown, the top surface board 1 of the guitar is fitted with a speaker enclosure protected by a cover plate 10. Control switches for the electronics which drive the speaker are also contained on the top surface of the guitar. The switches control, for example, volume, tremble, pitch, etc. Neither the electronics nor the switching arrangement form any part of the present invention and thus are not depicted in detail in the drawings. A jagged(4) cylindrical cup(5) is positioned within a round cut out opening(2) in the guitar surface board(1) extending into the guitar interior. The interior surface of the cup(5) is affixed with noise absorbent material(6). The speaker(8) is provided with a rim(3) which is fits and is captured by the grove(7). A baffled speaker cover(10) fits over the speaker(8) and extends over the flange(3). Screws pass through the packing(9), the cup flange(3), and the cover plate(10) to secure to the guitar top surface(1). Thus, the rim of the speaker(8) being fitted to the grove(7) of cylindrical cup(5) which is indirectly fixed to guitar body(1), the sound wave eminating from the speaker(8) is not directly transmitted to the guitar body(1) to prevent the vibration of the guitar body(1), and sound vibration flowing to the rear direction is absorbed into the absorbent material(6) which was affixed to the interior surface of the cup, and the sound being yield by the speaker(8) is effectively prevented.

When the guitar is played, lateral translation of the sound waves from the speaker to the guitar strings is prevented.

Thus in accordance with the above the afore mentioned objects are effectively attained.

Having thus described the invention, what is claimed is:

1. In an electric guitar having edge portions in its top board surface defining an opening for receiving a speaker in the body interior of the guitar, wherein the improvement comprises:

a rubber cup having a body wall extending into the interior of the guitar through said top board opening, said cup having a circumferential flange at its open end disposed to overlie the edge portions of said top board surface defining said board opening;

said cup further having a circumferential groove formed in its wall adjacent said flange, said groove being spaced from said flange a distance to be located in the interior of the guitar adjacent the inner surface of said top board when said cup is positioned within the board opening of said guitar;

a sound insulating material coated on the interior surfaces of the wall of said cup;

said speaker having a rim engageable with said cup wall groove for mounting said speaker within said cup;

a cap positioned over said board opening and having its peripheral edge disposed to overlie the flange of said cup; and fastening means extending through the peripheral edge of said cap, the flange of said cup and said top board surface for securing said cap and said cup to said guitar;

whereby said rubber cup and said insulating material within said cup together cooperate to prevent undue vibrations from being transmitted from said speaker to the body of said guitar.

2. The improved electronic guitar of claim 1 wherein the wall of said cup is jagged.

* * * * *